United States Patent
Harberts

(10) Patent No.: US 6,674,327 B2
(45) Date of Patent: Jan. 6, 2004

(54) COMBINED MULTIPLEXER AND SWITCHED GAIN CIRCUIT

(75) Inventor: Harry S. Harberts, San Marcos, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/114,559

(22) Filed: Apr. 2, 2002

(65) Prior Publication Data

US 2003/0185321 A1 Oct. 2, 2003

(51) Int. Cl.$^7$ .................................................. H03F 3/45

(52) U.S. Cl. .................. 330/254; 330/310; 327/407; 327/408; 327/411; 341/139

(58) Field of Search .................... 341/139; 330/254, 330/310; 327/407, 408, 411

(56) References Cited

U.S. PATENT DOCUMENTS

| | | | | |
|---|---|---|---|---|
| 5,352,987 A | * | 10/1994 | Harvey | 330/51 |
| 5,418,494 A | * | 5/1995 | Betti et al. | 330/254 |
| 5,861,831 A | * | 1/1999 | Murden et al. | 341/139 |
| 5,867,778 A | * | 2/1999 | Khoury et al. | 455/321 |
| 5,880,631 A | * | 3/1999 | Sahota | 330/51 |
| 5,926,068 A | * | 7/1999 | Harr | 330/254 |
| 6,239,646 B1 | * | 5/2001 | Navabi et al. | 327/407 |
| 6,331,803 B1 | * | 12/2001 | Zheng et al. | 330/254 |
| 6,515,518 B1 | * | 2/2003 | Minegishi | 327/65 |
| 6,552,612 B1 | | 4/2003 | Wilson | |

OTHER PUBLICATIONS

"Diversity Receiver Chipset CLC5526, CLC5957 and CLC 5902"; National Semiconductor Corporation; Feb. 9, 2000; 5 pgs.

Brannon, B., "Designing a Superheterodyne Receiver Using an IF Sampling Diversity Chipset", Analog Devices, Inc.; 2000; 3 pgs.

Oki, A.K., Gorman, G.K., Camou, J.B., Umemoto, D.K. and Kim, M.E.; "A GaAs HBT Monolithic Microwave Switched–Gain Amplifier with +31 db to −31 dB Gain in 2 dB Increments", IEEE 1989 Microwave and Millimieter–Wave Monolithic Circuits Symposium, pps. 83–86.

* cited by examiner

Primary Examiner—Michael Tokar
Assistant Examiner—Khai Nguyen
(74) Attorney, Agent, or Firm—John A. Miller; Warn, Burgess & Hoffmann, P.C.

(57) ABSTRACT

A combined multiplexer and switched gain circuit (250) that selectively multiplexes differential analog signals from a primary channel (20) and a diversity channel (22) in a diversity receiver system (10) to a single output. The circuit (250) is based on a current mode logic design where a plurality of separate conduction paths (278–284) are provided between a voltage line (266) and a current source (268). An output line (264) of the circuit (250) is coupled to each conduction path (278–284) so that the differential analog signals from the primary channel (20) and the diversity channel (22) can be selectively outputted to the circuit (250). Each conduction path (278–284) includes a gain device, such as degenerative resistor, that provides signal gain or no signal gain for that conduction path (278–284). Control signals are selectively applied to switching devices (310–324) and each conduction path (278–284) so that the conduction path (278–284) can be independently selected to provide the multiplexing.

27 Claims, 7 Drawing Sheets

COMBINED MULTIPLEXER AND SWITCHED GAIN CIRCUIT

BACKGROUND OF THE INVENTION

1. Field of the Invention

This invention relates generally to a multiplexer for multiplexing analog signals from a primary channel and a diversity channel in a diversity receiver and, more particularly, to a combined multiplexer and switched gain circuit for multiplexing differential analog signals from a primary channel and a diversity channel in a diversity receiver, where the multiplexer provides a gain path and a no-gain path for both the primary channel signals and the diversity channel signals.

2. Discussion of the Related Art

Historically, communications systems sampled analog signals to provide signal processing in the system. Modern trends generally represent signals in communications systems as time sampled digital data signals. Because of the availability of very high frequency circuits, it has become possible to process digital signals at higher and higher frequencies into the 100's of MHz. Digital signal processing offers the advantages of flexibility for change, absolute accuracy without the need for calibration of analog components that are subjected to temperature and aging effects, and the ability to perform very complex signal processing at modest costs. Further, digital signal processing offers the possibility of sharing circuit components for multiple tasks, further reducing system hardware and related costs. However, digital circuit components become very expensive at high frequencies. Further, for those digital systems that process both radio frequency (RF) and intermediate frequency (IF) signals, extreme care must be taken to maintain the accuracy of the signal, especially for waveforms employing complex modulation.

Cellular telephone base stations employ many receiver circuits for receiving and processing cellular telephone signals. Each receiver circuit typically employs two channels, a primary channel and a diversity channel, each having a separate antenna, so that the receiver circuit can select which of the two received signals is the strongest for subsequent processing. Some receiver circuits combine the primary channel and diversity channel signals for increased performance. This allows the receiver to be more reliable by lessening the chance that cellular calls are dropped. However, receivers of this type have been limited in their effectiveness for reducing circuit components, reducing the size and cost of IF sampling circuits, and maintaining signal fidelity at high frequencies.

Receiver circuits for cellular base stations employ automatic gain control (AGC) using variable gain amplifiers (VGAs) and multiplexers for amplifying and selecting analog signals propagating through the primary and diversity channels. The analog signals are also applied to an analog-to-digital converter (ADC) to be converted to digital signals for digital processing. One or more ADCs are employed at various locations in the circuit relative to the VGA and multiplexer.

The known Analog Devices AD6600 Diversity Receiver chipset provides independent channel attenuation, multiplexing, signal gain and analog-to-digital conversion on a single chip. In this design, an analog multiplexer is preceded by individual variable gain attenuator stages for each channel and a peak detecting gain control circuit.

U.S. Pat. No. 5,861,831 discloses a clock-to-clock auto-ranging ADC that operates directly on an analog signal in the IF band or higher to track it's gain range on a clock-to-clock basis to produce a digital signal that maintains high resolution of the analog signal without clipping or loss of signal sensitivity. The ADC samples the analog signal at sufficiently high frequency so that a peak detector can accurately determine the maximum signal level over at least one-half of a signal period, and then reset the signal gain going into the ADC prior to the beginning of the next sample period. The '831 patent offers improvements for analog-to-digital conversion, but does not address the multiplexing architecture for high frequency. Further, combining all of the functions as is done in the '831 patent onto a single chip slows the speed of the signal throughput and compromises the isolation between the primary and diversity channels.

National Semiconductor has a diversity receiver chipset of the type being discussed herein that operates at high frequency, but requires several separate chips in various architectures. Further, this chipset does not multiplex the analog signals, but has a separate parallel VGA and ADC path for each primary and diversity channel. This design provides good isolation, but drives up the cost of implementation.

SUMMARY OF THE INVENTION

In accordance with the teachings of the present invention, a combined multiplexer and switched gain circuit is disclosed that selectively multiplexes differential analog signals from a primary channel and a diversity channel in a diversity receiver to a single output. The circuit is based on a current mode logic design where a plurality of separate conduction paths are provided between a voltage line and a current source. An output of the circuit is coupled to each conduction path so that the differential analog signals from the primary channel and the diversity channel can be selectively outputted from the circuit. Each conduction path includes a gain device, such as a degenerative resistor, that provides signal gain or no signal gain for that conduction path. Control signals are selectively applied to switching devices in each conduction path so that a particular conduction path can be independently selected to provide the multiplexing.

In one embodiment, the switching devices are heterojunction bipolar transistors. The differential analog signals in the primary channel are applied to the base terminal of bipolar transistors in two of the conduction paths, and the differential analog signals in the diversity channel are applied to the base terminal of bipolar transistors in two of the other conduction paths. One of the primary channel conduction paths and one of the diversity channel conduction paths provide signal gain, and the other primary channel conduction path and the other diversity channel conduction path provide no signal gain. A separate control signal is applied to the base terminal of other bipolar transistors in each conduction path so that a particular conduction path can be selected to provide current flow and cause the analog signal applied to that conduction path to be provided on the output.

Additional objects, advantages and features of the present invention will become apparent from the following description and appended claims, taken in conjunction with the accompanying drawings.

DETAILED DESCRIPTION OF THE EMBODIMENTS

The following discussion of the invention directed to a variable gain amplifier and multiplexer provided on a common integrated circuit chip for a dual diversity receiver system is merely exemplary in nature, and is in no way intended to limit the invention or its applications or uses. For example, the multiplexer and amplifier are employed in conjunction with a diversity receiver system in a cellular base station. However, as will appreciated by those skilled in the art, the amplifier and multiplexer of the present invention can be employed in other analog or digital processing systems.

Figure 1:
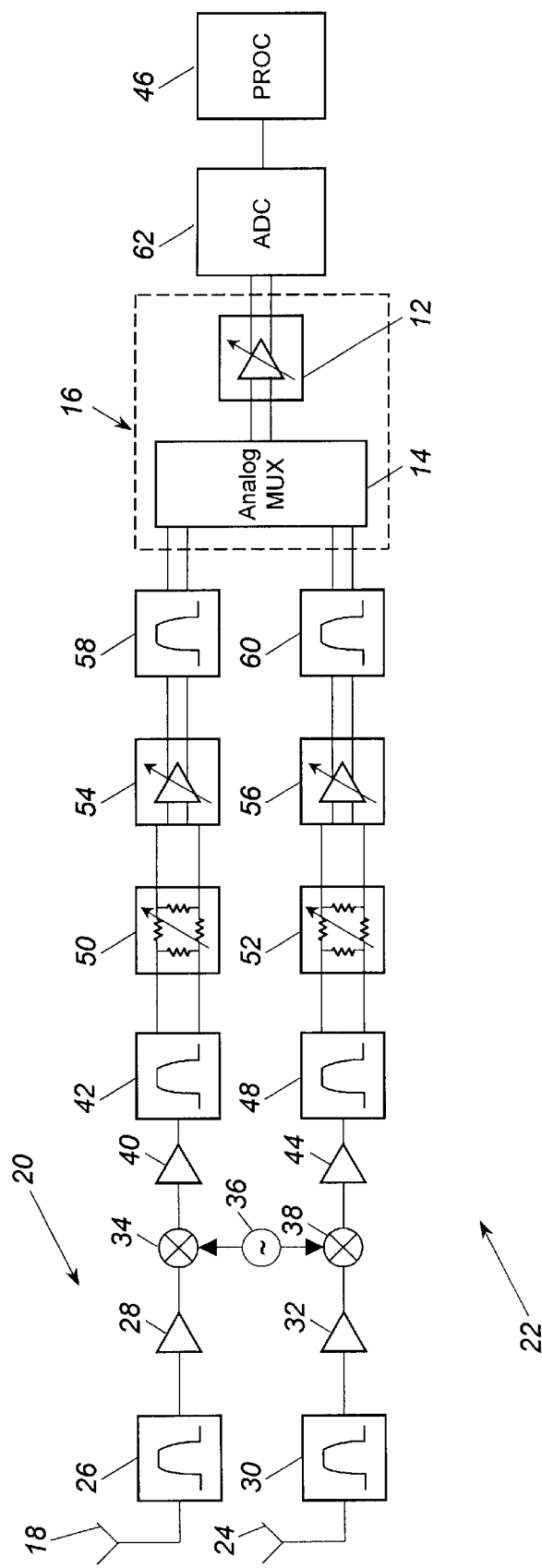
FIG. 1 is a schematic diagram of a diversity receiver for a cellular telephone base station, where the receiver employs a variable gain amplifier/multiplexer RF integrated circuit, according to an embodiment of the present invention.

FIG. 1 is a schematic block diagram of a diversity receiver system 10 for a cellular telephone base station, according to an embodiment of the present invention. As will be discussed in detail below, the system 10 employs a VGA 12 and an analog multiplexer 14 formed on a common RF integrated circuit (IC) chip 16, according to an embodiment of the present invention. The system 10 includes a primary channel 20 and a diversity channel 22 both receiving the same analog cellular signal from an antenna 18 and 24, respectively, to provide system redundancy for reliability purposes. The received high frequency analog signal is filtered by an image filter 26 and is amplified by a low noise amplifier (LNA) 28 in the primary channel 20, and is filtered by an image filter 30 and is amplified by an LNA 32 in the diversity channel 22.

The primary channel 20 includes a mixer 34 that receives the signal from the antenna 18 and a lower frequency signal from a local oscillator (LO) 36 to down-convert the high frequency analog signal to an IF signal suitable for A, subsequent processing in a manner that is well understood to those skilled in the art. Likewise, the diversity channel 22 includes a mixer 30 that receives the signal from the antenna 24 and the signal from the LO 36 to down-convert the high frequency signal to an IF signal for the same purpose.

The IF signal in the primary channel 20 is amplified by an amplifier 40 and is filtered by a bandpass filter 42. The IF signal in the diversity channel 22 is amplified by an amplifier 44 and is filtered by a bandpass filter 48. The amplifiers 40 and 44 amplify the IF signals to suitable levels for subsequent processing. In this embodiment, the filters 42 and 48 convert the single input signals to differential output signals. In an alternate embodiment, the signals could be directed off-chip to be converted to differential signals by suitable circuitry (not shown), such as a transformer. A differential signal is a signal that is split into two parts that are 180° out of phase with each other and combine to form the complete signal. As is known in the art, differential signals are sometimes generated in communications systems of this type to provide greater noise immunity.

The differential IF signal in the primary channel 20 is applied to a step attenuator 50 and the differential IF signal in the diversity channel 22 is applied to a step attenuator 52. The attenuators 50 and 52 provide a reduction in signal gain if the magnitude of the received signal is too high for the system components. The attenuators 50 and 52 can provide any suitable level of attenuation for a particular system. In this embodiment, the attenuators 50 and 52 receive a control signal from a digital signal processor 46, discussed in more detail below, that attenuates the signals to a lower power level, if necessary, to prevent system saturation and part damage in the event that the received analog signal is too strong. The attenuators 50 and 52 can be any attenuator suitable for the purposes described herein, such as a PIN diode attenuator. One suitable PIN diode attenuator, according to the invention, will be discussed below with reference to FIG. 7.

The differential signal from the attenuator 50 in the primary channel 20 is applied to a gain trim device 54, and the differential signal from the attenuator 52 in the diversity channel 22 is applied to a gain trim device 56. The devices 54 and 56 provide an attenuation or a gain to the signal so that insertion losses and gain variations in the system components caused by variations in manufacturing can be calibrated. In this embodiment, the devices 54 and 56 provide attenuation and gain in 1 dB steps from −7.5 dB to +7.5 dB. However, as will be appreciated by those skilled in the art, these values are application specific. The devices 54 and 56 can be any device suitable for the purposes described herein, such as a switched gain device. One suitable device will be discussed in detail below with reference to FIG. 6. The differential signals are then applied to a Nyquist filter 58 in the primary channel 20 and a Nyquist filter 60 in the diversity channel 22.

As shown, the differential signals in both channels 20 and 22 are then applied to the multiplexer 14. The multiplexer 14 sequentially selects the differential signals in the primary channel 20 and the diversity channel 22 to be output therefrom. Particularly, a clock signal, 52 MHz in one embodiment, causes the multiplexer 14 to consecutively select one of the inputs to be the output of the multiplexer 14. Thus, the output of the multiplexer 14 is an analog signal that includes data from one of the channels 20 or 22 at a given instant in time. According to the invention, the multiplexer 14 also selectively provides signal amplification. The analog signal is then amplified by the VGA 12 to provide automatic gain control (AGC). According to the invention, the multiplexer 14 is positioned before the VGA 12 to reduce part count. Particularly, only one VGA is required because the multiplexer 14 outputs a single analog signal. The multiplexer 14 and the VGA 12 will be discussed in more detail below.

The selected and amplified signal is then sent to an ADC 62 to be converted to a digital signal as is required by the processor 46. The digital signal is then sent to the digital processor 46 for processing consistent with the discussion herein. The processor 46 processes the digital data stream from the ADC 62, and from this information provides a variety of control signals to the system 10. Particularly, as will be discussed in detail below, the processor 46 provides a control signal to the step attenuators 50 and 52 to determine whether to provide the attenuation or not based on signal strength. Further, the processor 46 provides a control signal to the gain trim devices 54 and 56 to determine how much gain or attenuation to apply to the differential analog signals for proper calibration. Also, the processor 46 provides control signals to the multiplexer 14 to provide a selection signal and gain signal for the output therefrom. Additionally, the processor 46 provides a selective gain signal to the VGA 12 to determine the amount of gain provided therefrom.

Figure 2:
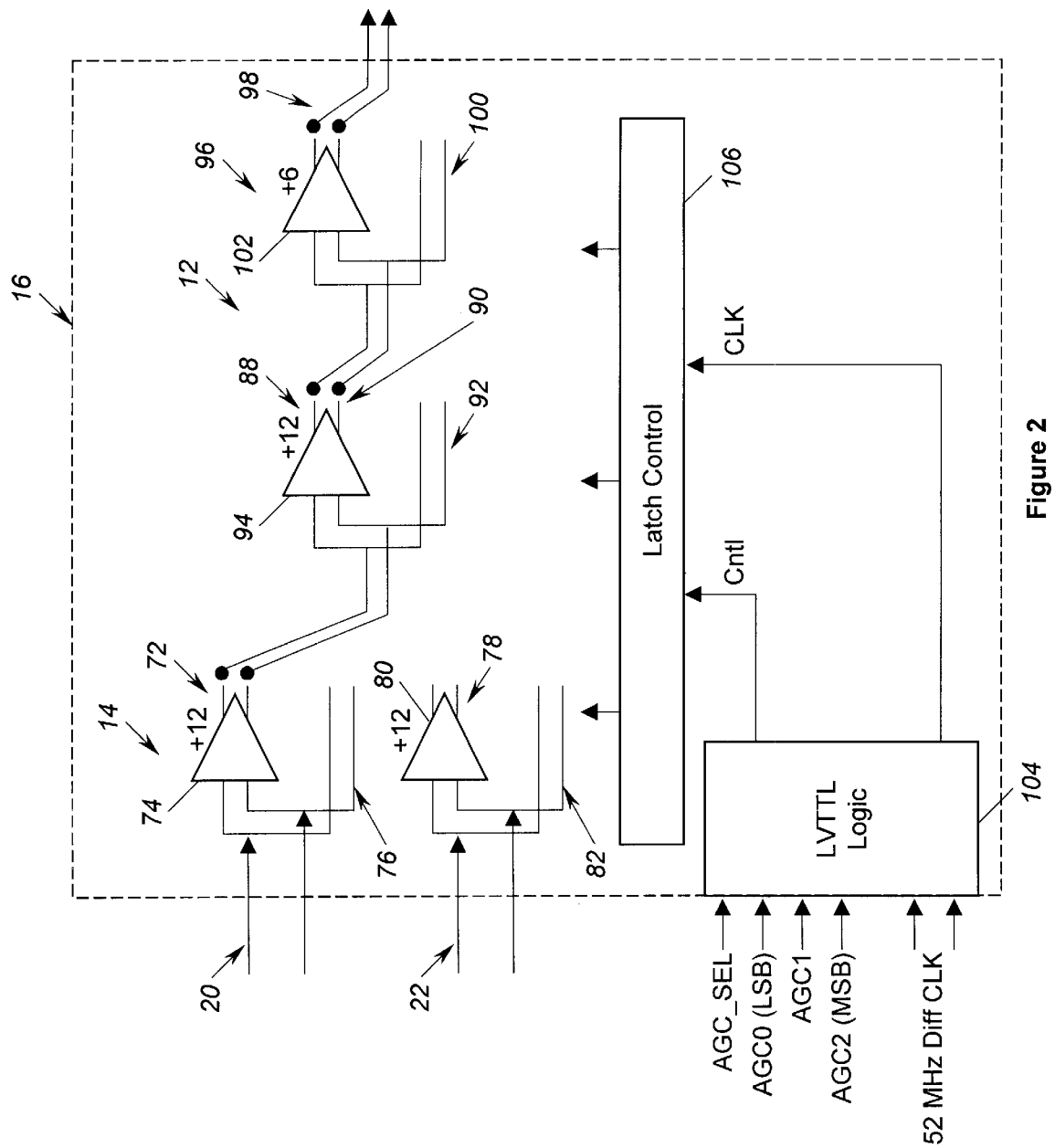
FIG. 2 is a detailed schematic diagram of the variable gain amplifier/multiplexer integrated circuit of FIG. 1 separated from the receiver.

FIG. 2 is a schematic diagram of the RFIC chip 16 separated from the system 10. The multiplexer 14 includes an amplified path 72, including a differential amplifier 74, and a non-amplified path 76 that receive the differential signals from the primary channel 20. Further, the multiplexer 14 includes an amplified path 78, including an amplifier 80, and a non-amplified path 82 that receive the differential signals from the diversity channel 22. In this embodiment, the amplified paths 72 and 78 amplify the differential signals by +12 dB. However, this is by way of a non-limiting example, in that other designs may employ different levels of gain. As shown, the multiplexer 14 is selecting the amplified path 72.

The VGA 12 includes a first amplifier stage 88 having an amplified path 90 and a non-amplified path 92, where an amplifier 94 is provided in the amplified path 90. The VGA 12 also includes a second amplifier stage 96 including an amplified path 98 and a non-amplified path 100, where the amplified path 98 includes a differential amplifier 102. As will be discussed in detail below, the first amplifier stage 88 applies either a +12 dB gain or no gain to the signal selected by the multiplexer 14, and the second amplifier stage 96 provides a +6 dB gain or no gain to the signal selected by the multiplexer 14. Thus, by combining the gained choices of the various paths of the combination of the multiplexer 14 and the VGA 12 as discussed herein, the differential signal on either the primary channel 20 or the diversity channel 22 can add either 0, +6, +12, +18, +24, +30 dB gain at the output of the RFIC chip 16. These gains are application specific and can be other gain choices in other embodiments within the scope of the present invention.

Gain selection control signals are applied to a low volt transistor-transistor logic (LVTTL) circuit 104. Particularly, an AGC SEL digital control line from the processor 46 selects the primary channel 20 or the secondary channel 22, and AGC0, AGC1 and AGC2 digital control lines from the processor 46 determine which gain the RFIC chip 16 will provide to the differential signal selected. The circuit 104 includes any suitable digital logic components that decode the digital control signals consistent with the discussion herein. The decoded control signal from the circuit 104 is sent to a latch control circuit 106 including a series of flip-flops (not shown) that hold the select control signal for each clock cycle. An output of the latch control circuit 106 is applied to the multiplexer 14, the first amplifier stage 88 and the second amplifier stage 96 to select one of the amplified path or non-amplified path in each component or stage. The proper load, for example 600 ohms, must be applied to the output of the RFIC chip 16 so that the desired gain of the analog differential signal is achieved.

Figure 3:
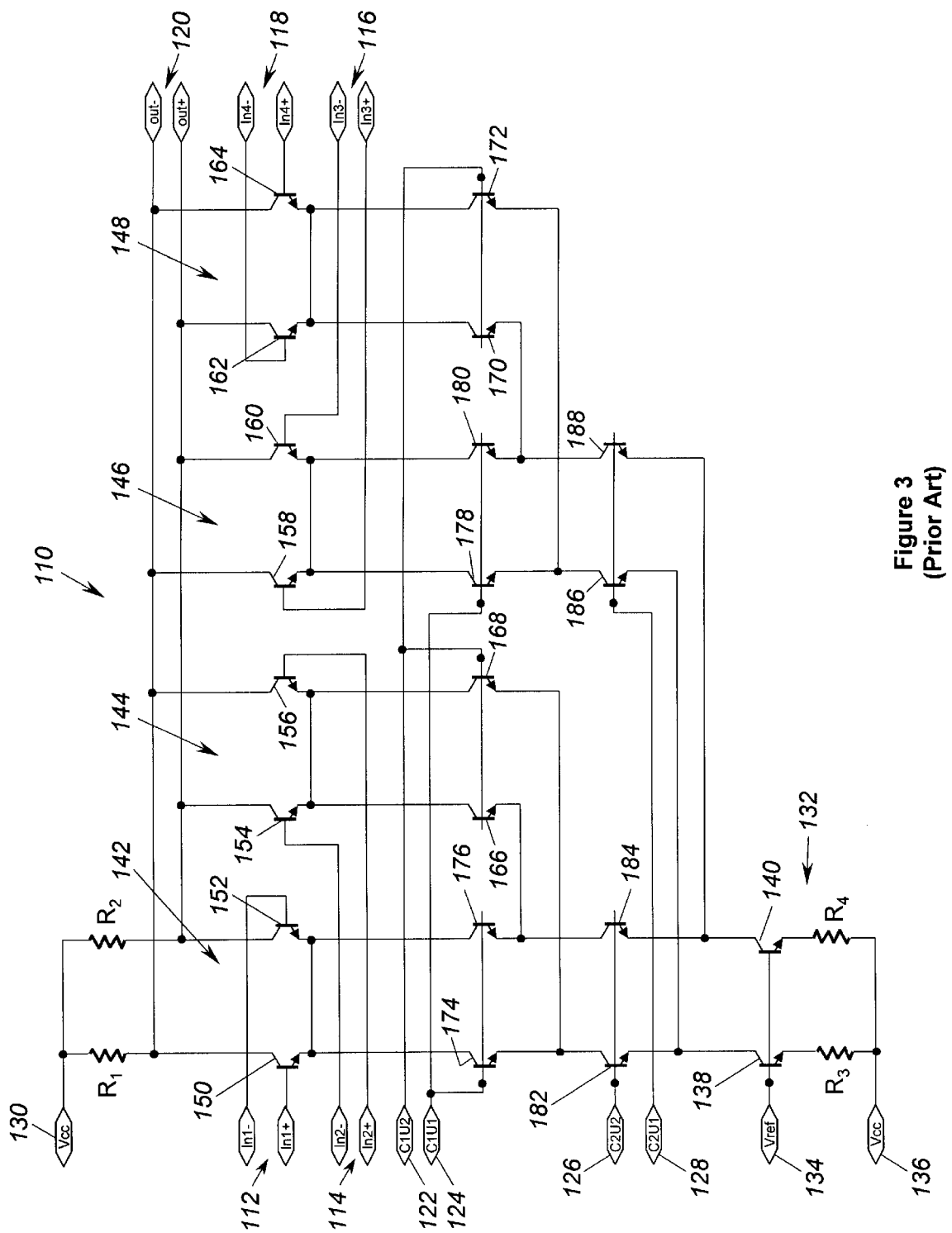
FIG. 3 is a schematic diagram of a known analog multiplexer circuit employing bipolar transistors.

FIG. 3 is a schematic diagram of a known multiplexer 110. The design of the multiplexer 110 employs current mode logic (CML) in a cell design. The multiplexer 110 further employs heterojunction bipolar transistors (HBTs) that are optimized for wide band signals (DC to 2.5 GHZ), switching speed (100 MHz) and linearity (typically third order intercept of 30 dB). Other designs consistent with the invention can be implemented in various transistor technologies, including Si bipolar, SiGe HBT, GaAs HBT, InP HBT, and CMOS FET or other FET technologies.

The multiplexer 110 receives four differential analog input signals on differential input lines 112, 114, 116 and 118, and selects one of the input signals to be provided on differential output lines 120. Also, four digital control lines 122, 124, 126 and 128 are coupled to the multiplexer 110 that provide the select function. The multiplexer 110 receives a voltage potential on line 130 that is applied to resistors $R_1$ and $R_2$. Further, a current source 132 is coupled to output reference ports 134 and 136, and includes resistors $R_3$ and $R_4$ and bipolar transistors 138 and 140. In order to operate properly, the values of the resistors $R_1$ and $R_2$ and the values of the resistors $R_3$ and $R_4$ must be the same or nearly the same value.

As will be discussed below, the multiplexer 110 selects which differential input to transfer to the output lines 120 by providing current conduction from the voltage line 130 to the current source 132 through one of four conduction paths 142, 144, 146 and 148. Each conduction path 142–148 includes two lines that are coupled to the output lines 120. Four sets of two bipolar transistors must conduct to provide current flow through the lines of a particular conduction paths 142–148. A bipolar transistor is caused to turn on or conduct by applying a suitable DC bias to it's base terminal. The lines of the conduction path 142–148 are interconnected as shown to provide current conduction from the line 130 to the current source 132.

The input lines 112 are coupled to the base terminal of bipolar transistors 150 and 152 in the conduction path 142. The input lines 114 are coupled to the base terminal of bipolar transistors 154 and 156 in the conduction path 144. The input lines 116 are coupled to the base terminal of bipolar transistors 158 and 160 in the conduction path 146. The input lines 118 are coupled to the base terminal of bipolar transistors 162 and 164 in the conduction path 148. The control line 122 is coupled to the base terminal of bipolar transistors 166 and 168 in the conduction path 144 and the base terminal of bipolar transistors 170 and 172 in the conduction path 148. The control line 124 is coupled to the base terminal of bipolar transistors 174 and 176 in the conduction path 142 and the base terminal of bipolar transistors 178 and 180 in the conduction path 146. The control line 126 is coupled to the base terminal of bipolar transistors 182 and 184 in the conduction path 142. The control line 128 is coupled to the base terminal of bipolar transistors 186 and 188 in the conduction path 146.

There will always be a DC bias signal on the input lines 112–118 whether or not the RF input signal is applied to the lines 112–118. Therefore, any of the transistors 150–164 will be able to conduct their associated conduction path given the control lines in that path are properly configured. Thus, the control lines 122–128 determine which conduction path 142–148 will conduct to provide the signal selection process. To select the input lines 112, the conduction path 142 is caused to conduct by providing a logical high signal on the control lines 124 and 126 to turn on the bipolar transistors 174, 176, 182 and 184. To select the input lines 114, the conduction path 144 is caused to conduct by providing a logical high signal on the control lines 122 and 126 to turn on the bipolar transistors 166, 168, 182 and 184. To select the input lines 116, the conduction path 146 is caused to conduct by providing a logical high signal on the control lines 124 and 128 to turn on the bipolar transistors 178, 180, 186 and 188. To select the input lines 118, the conduction path 148 is caused to conduct by providing a logical high signal on the control lines 122 and 128 to turn on the bipolar transistors 170, 172, 186 and 188. It will be apparent to those skilled in the art how this cell architecture can be expanded to select signals on more than four differential input lines.

Figure 4:
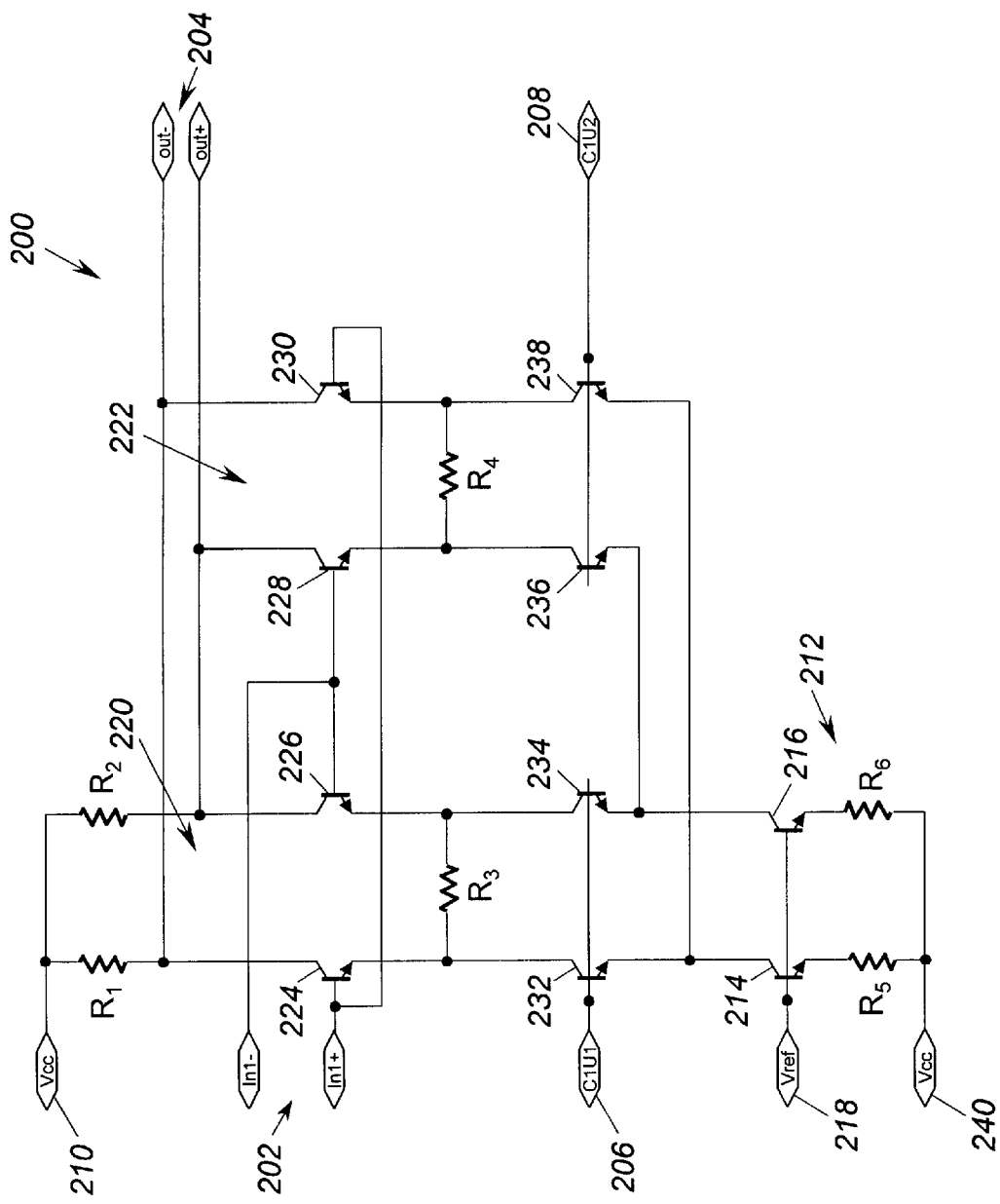
FIG. 4 is a schematic diagram of a known dual switched gain circuit employing bipolar transistors.

FIG. 4 is a schematic diagram of a known dual switched gain circuit 200 that is applicable to selectively amplify a differential signal applied thereto for two different gains. In one embodiment, the circuit 200 can be used for the amplifier stages 88 and 96. The CML architecture of the gain circuit 200 is based on the same principles as the multiplexer 110 above. The gain circuit 200 includes a pair of differential signal input lines 202, a pair of differential output lines 204, a first control line 206, a second control line 208 and a voltage line 210 coupled to resistors $R_1$ and $R_2$. The gain circuit 200 also includes a current source 212 having bipolar transistors 214 and 216 and resistors $R_5$ and $R_6$ coupled to voltage reference ports 218 and 240. The gain circuit 200 further includes a first gain conduction path 220 and a second gain conduction path 222 between the voltage line 210 and the current source 212. Both conduction paths 220 and 222 are coupled to the output lines 204.

The gain paths 220 and 222 provide a different gain as set by degenerative resistors $R_3$ and $R_4$ respectively. The resistors $R_3$ and $R_4$ are referred to as degenerative because they are tied to the emitter terminal of a bipolar transistor set (e.g., $R_3$ to transistors 224 and 226, $R_4$ to transistors 228 and 230) of a Gilbert Mixer type architecture. A transfer function determined by the ratio of the value of the resistor $R_3$ to the values of the resistors $R_1$ and $R_2$ determines the gain of the conduction path 220. Likewise, the ratio of the value of the resistor $R_4$ to the values of the resistors $R_1$ and $R_2$ determines the gain of the conduction path 222. The transfer function is defined by $2R_L/(R_G+2r_e)$, where $R_L$ is $R_1$ or $R_2$ (since they are identical), $R_G$ is the path gain degenerative resistor, and re is the emitter resistance of the respective bipolar transistor. If $R_G$ is proportionately less than $R_L$ then the conduction path provides gain, and if $R_G$ is proportionately greater than $R_L$ then the conduction path provides attenuation. If the gain circuit 200 is used for the amplifier stage 88 or 96, then the value of one of the resistors $R_3$ or $R_4$ will be selected such that the associated conduction path provides a gain of one, and passes the input signal through unchanged. Alternately, the other resistor will be sized to provide the desired gain. The non-amplified path 92 or 100 would be the conduction path that does not provide gain, and the amplified path 90 or 98 would be the conduction path that provided gain.

The input lines 202 are coupled to the base terminal of bipolar transistors 224 and 226 in the conduction path 220 and the base terminal of bipolar transistors 228 and 230 in the conduction path 222. The differential analog input signal is continually applied to the input lines 202 and the bipolar transistors 224, 226, 228 and 230 are all properly DC biased since the stages are DC coupled. Therefore, the control lines 206 and 208 determine which path 220 or 222 will conduct. Particularly, a logical high signal on the control line 206 is applied to the base terminal of bipolar transistors 232 and 234 to turn the transistors 232 and 234 on and cause the conduction path 220 to conduct. Likewise, a logical high signal on the control line 208 is applied to the base terminal of bipolar transistors 236 and 238 to turn the transistors 236 and 238 on and cause the conduction path 222 to conduct. The amplified input signal from the conducting path is provided on the output lines 204.

Figure 5:
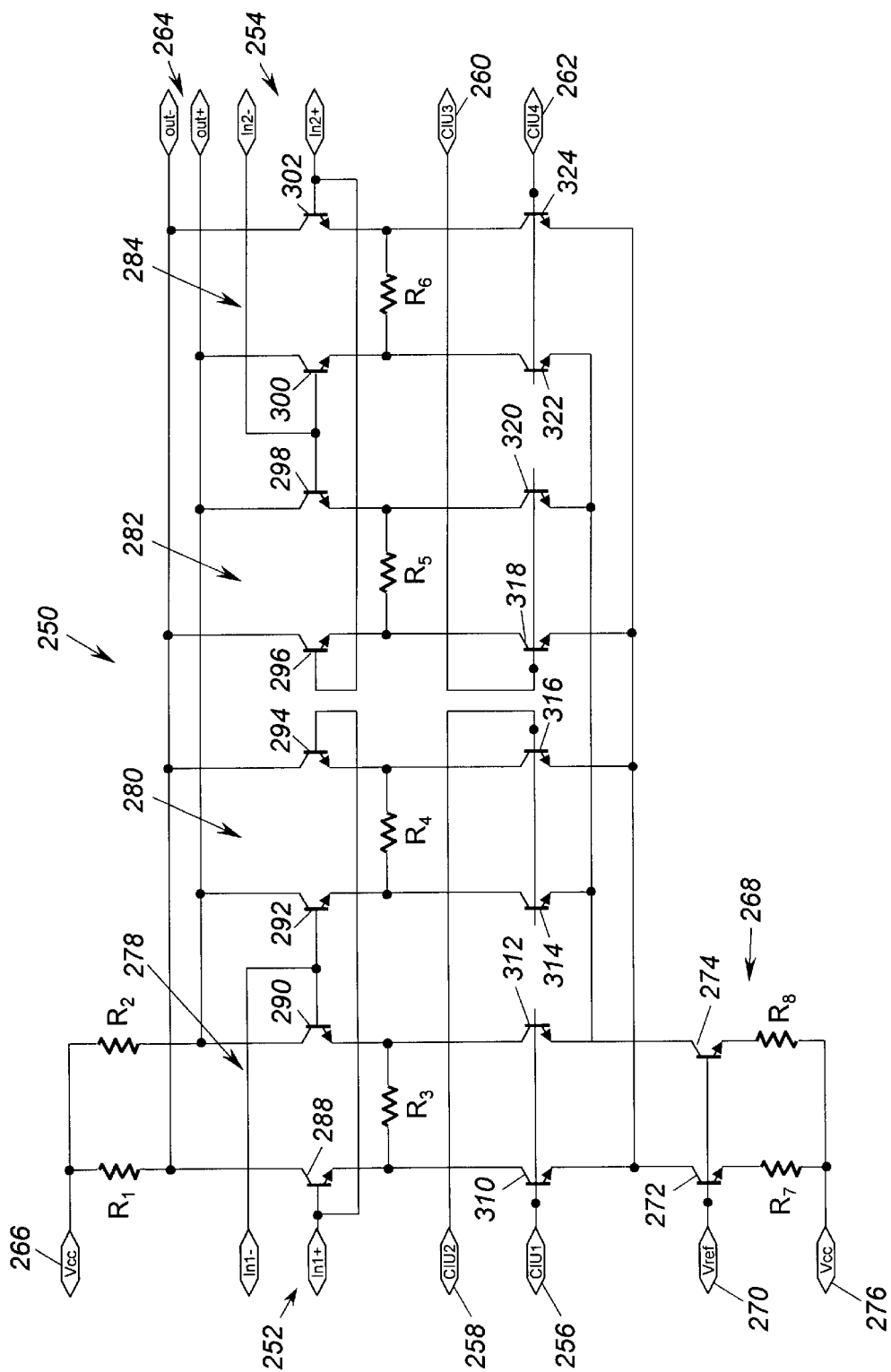
FIG. 5 is a schematic diagram of an analog multiplexer/switched gain circuit that provides signal gain and is applicable for the multiplexer shown in FIG. 2, according to an embodiment of the present invention.

FIG. 5 is a schematic diagram of a multiplexer/switched gain circuit 250, according to an embodiment of the present invention, that can be used for the multiplexer 14 discussed above. The design of the circuit 250 combines features of the multiplexer 110 and the gain circuit 200. The circuit 250 includes first differential input lines 252, second differential input lines 254, a first digital control line 256, a second digital control line 258, a third digital control line 260, a fourth digital control line 262, differential output lines 264, a voltage line 266 and a current source 268. The voltage line 266 is coupled to resistors $R_1$ and $R_2$ in the same manner as discussed above. Likewise, the current source 268 includes resistors $R_7$ and $R_8$ and bipolar transistors 272 and 274 coupled to output reference ports 270 and 276. The circuit 250 defines four gain conduction paths between the voltage line 266 and the current source 268, including a first gain conduction path 278, a second gain conduction path 280, a third gain conduction path 282 and a fourth gain conduction path 284. Degenerative resistors $R_3$, $R_4$, $R_5$ and $R_6$ in the respective conduction path 278–284 determine the gain (or no gain) for that path. Each conduction path 278–284 is coupled to the output lines 264.

The first differential input lines 252 are coupled to the base terminal of bipolar transistor 288 and 290 in the first conduction path 278 and to the base terminal of bipolar transistors 292 and 294 in the conduction path 280. The second differential input lines 254 are coupled to the base terminal of bipolar transistors 296 and 298 in the conduction path 282 and to the base terminal of bipolar transistors 300 and 302 in the conduction path 284. The control line 256 is coupled to the base terminal of bipolar transistors 310 and 312 in the conduction path 278. The control line 258 is coupled to the base terminal of bipolar transistors 314 and 316 in the conduction path 280. The control line 260 is coupled to the base terminal of bipolar transistors 318 and 320 in the conduction path 282. The control line 262 is coupled to the base terminal of bipolar transistors 322 and 324 in the conduction path 284.

A DC bias is applied to the base terminal of the transistors 288–302 so that they can be turned on. The control lines 256–262 determine which conduction path 278–284 is selected to select the input signal with the desired gain. As discussed herein, a logical high on one control line 256–262 means that a higher DC voltage is applied to that control line relative to the other control lines. A logical high signal on the control line 256 causes the conduction path 278 to conduct to provide the input signal on the lines 252 to be output on the output lines 264 with the gain determined by the resistor $R_3$. A logical high signal on the control line 258 causes the conduction path 280 to conduct to provide the input signal on the lines 252 to be output on the output lines 264 with the gain determined by the resistor $R_4$. A logical high signal on the control line 260 causes the conduction path 282 to conduct to provide the input signal on the lines 254 to be output on the output lines 264 with the gain determined by the resistor $R_5$. A logical high signal on the control line 262 causes the conduction path 284 to conduct to provide the input signal on the lines 254 to be output on the output lines 264 with the gain determined by the resistor $R_6$.

If the circuit 250 is used for the multiplexer 14, then one of the conduction paths for both input signals would have no gain. More specifically, in order to provide the non-amplified path 76, one of the resistors $R_3$ or $R_4$ would provide a no-gain conduction path for the input signal on lines 252. Likewise, in order to provide the non-amplified path 82, one of the resistors $R_5$ or $R_6$ would provide a no-gain conduction path for the input signal on lines 254.

The gain circuit 250 provides certain advantages including limited power consumption because a single current source is employed. Further, other gain conduction paths can be added that only require adding more control lines and transistors without the need for additional power. Although each input has two gain paths in this design, other embodiments can employ more gain paths for each input. Further, different numbers of gain paths can be provided for each input.

Figure 6:
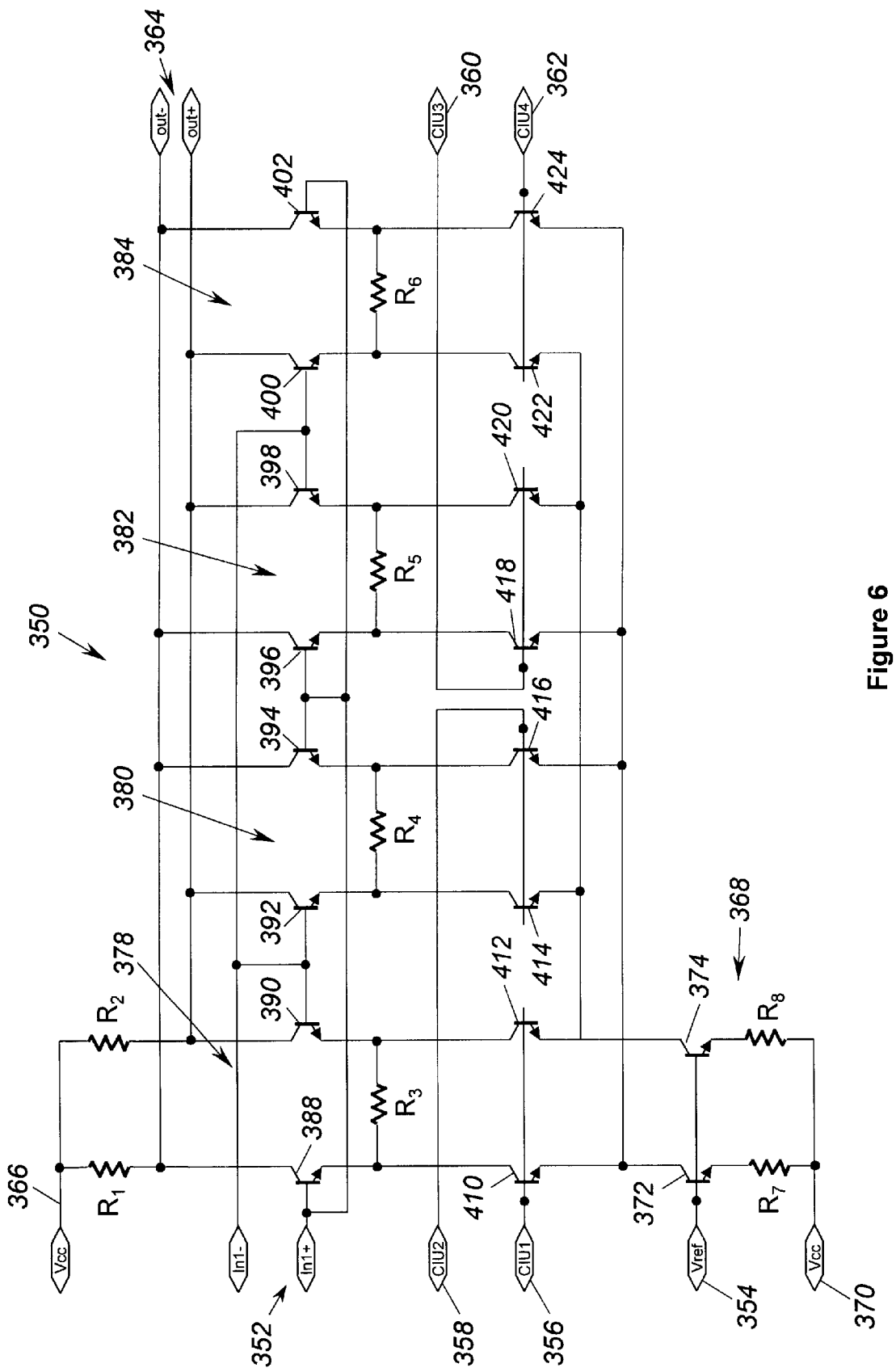
FIG. 6 is a schematic diagram of a quad switched gain circuit applicable to be used in each channel of the receiver shown in FIG. 1, according to an embodiment of the present invention.

FIG. 6 is a schematic diagram of a quad switched gain circuit 350, according to an embodiment of the present invention, based on the CML cell architecture discussed herein. The gain circuit 350 receives a differential analog input signal on input lines 352 and applies a gain or attenuation thereto based on a selected gain configuration. In one embodiment, the gain circuit 350 has particular application for the gain trim devices 54 and 56 to provide 1 dB changes in attenuation or gain between −7.5 dB and +7.5 dB. However, as will be appreciated by those skilled in the art, the gain circuit 350 has application for other circuits, such as a transmitter circuit.

The circuit 350 includes a first control line 356, a second control line 358, a third control line 360, a fourth control line 362, differential output lines 364, a voltage line 366 and a current source 368. The voltage line 366 is coupled to resistors $R_1$ and $R_2$ in the same manner as discussed above. Likewise, the current source 368 includes resistors $R_7$ and $R_8$ and bipolar transistors 372 and 374 that are coupled to reference ports 354 and 370. The circuit 350 defines four conduction paths between the voltage line 366 and the current source 368, including a first conduction path 378, a second conduction path 380, a third conduction path 382 and a fourth conduction path 384. Degenerative resistors $R_3$, $R_4$, $R_5$ and $R_6$ in the respective conduction path 378–384 determine the gain for that path. Each conduction path 378–384 is coupled to the output lines 364.

The differential input lines 352 are coupled to the base terminal of bipolar transistors 388 and 390 in the conduction path 378, to the base terminal of bipolar transistors 392 and 394 in the conduction path 380, to the base terminal of bipolar transistors 396 and 398 in the conduction path 382 and to the base terminal of bipolar transistors 400 and 402 in the conduction path 384. The control line 356 is coupled to the base terminal of bipolar transistors 410 and 412 in the conduction path 378. The control line 358 is coupled to the base terminal of bipolar transistors 414 and 416 in the conduction path 380. The control line 260 is coupled to the base terminal of bipolar transistors 418 and 420 in the conduction path 382. The control line 362 is coupled to the base terminal of bipolar transistors 422 and 424 in the conduction path 384.

A suitable DC bias is applied to the base terminals of the transistors 388–402 so that the transistors 388–402 can be turned on. The control lines 356–362 determine which conduction path 378–384 is selected to set the desired gain or attenuation for the input signal. A logical high signal on the control line 356 causes the conduction path 378 to conduct to provide the gain or attenuation determined by the resistor $R_3$ to be provided on the output lines 364. A logical high signal on the control line 358 causes the conduction path 380 to conduct to provide the gain or attenuation determined by the resistor $R_4$ to be provided on the output lines 364. A logical high signal on the control line 360 causes the conduction path 382 to conduct to provide the gain or attenuation determined by the resistor $R_5$ to be provided on the output lines 364. A logical high signal on the control line 362 causes the conduction path 384 to conduct to provide the gain or attenuation determined by the resistor $R_6$ to be provided on the output lines 364.

As discussed above, the ratio of the values of the resistors $R_1$ and $R_2$ to the value of the degenerative resistor in the particular conduction path 378–384 determines whether the conduction path 378–384 will provide gain or attenuation. For the embodiment discussed herein, gain or attenuation is provided in 1 dB steps between −7.5 dB and +7.5 dB (16 steps). As is apparent, the circuit 350 only provides four variations in gain or attenuation. In order to get the sixteen steps of gain, it is necessary to provide another quad switched gain circuit cascaded with the circuit 350. Particularly, a second switched gain circuit would be coupled to the output lines 364 so that the analog input signal applied to the input lines 352 goes through two conduction paths to provide the desired gain or attenuation. Each conduction path in both switched circuits would have a different resistive value. One of ordinary skill would readily understand how to determine those resistive values to provide the sixteen 1 dB steps.

In an alternate embodiment, the circuit 350 can have sixteen sections or conduction paths to provide the desired sixteen 1 dB steps of gain. However, such a design would require sixteen control lines, thus increasing the control circuitry. Other designs within the scope of the present invention can employ switched circuits having more or less sections and more or less coupled switched circuits to provide different variations in dB steps as well as a wider or lesser gain and attenuation range.

Figure 7:
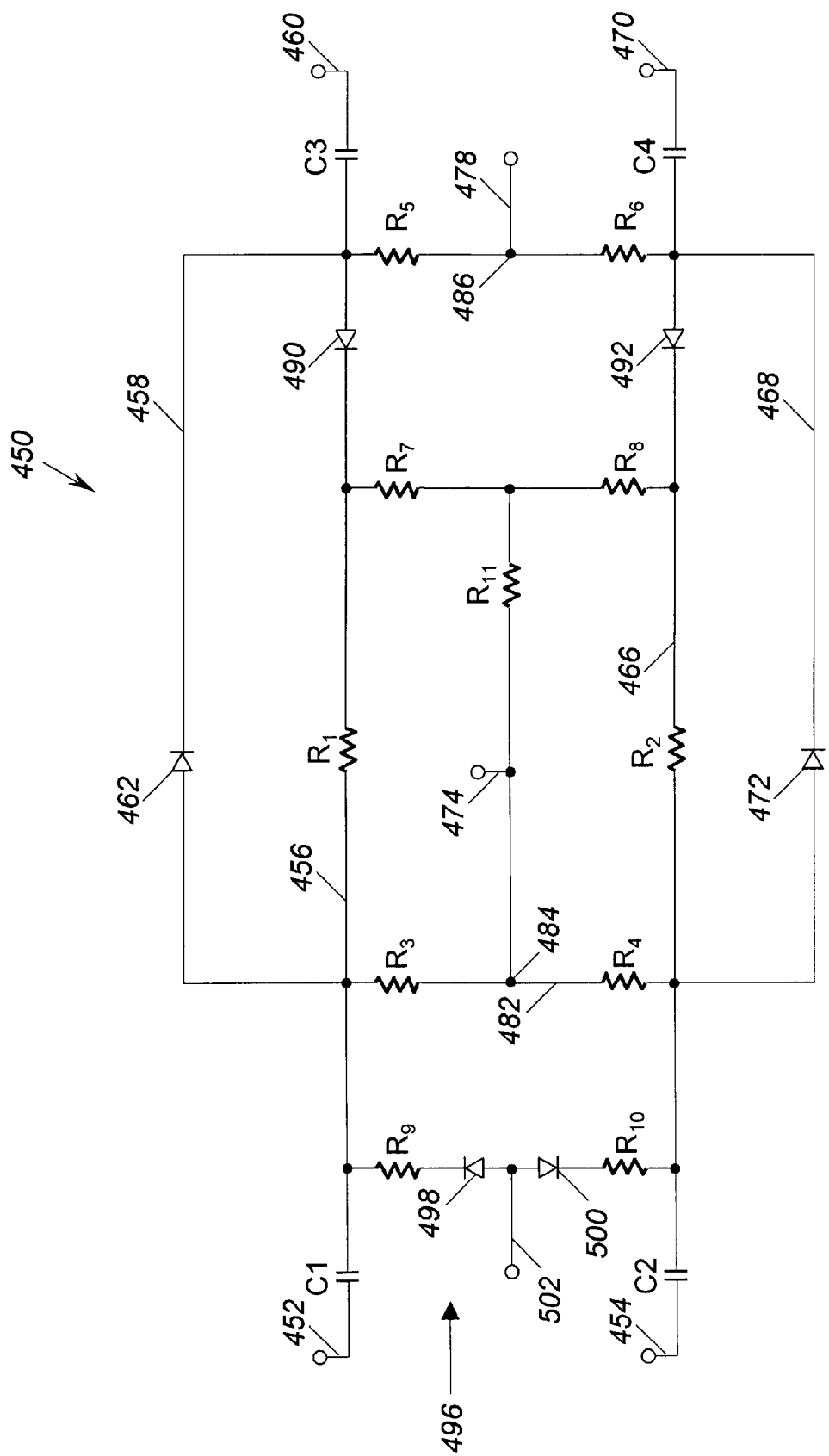
FIG. 7 is a schematic diagram of a differential PIN diode attenuator applicable to be used in each channel of the receiver shown in FIG. 1, according to an embodiment of the present invention.

FIG. 7 is a schematic diagram of a differential PIN diode attenuator 450 that can be used for either of the step attenuators 50 or 52 discussed above, according to an embodiment of the present invention. As will become apparent from the discussion below, the attenuator 450 includes all of it's components on a single integrated circuit chip because it eliminates the inductors employed in known differential PIN diode attenuator designs. The inductors were necessary in the known designs to prevent the RF input signals from entering the DC control bias line. Particularly, the conventional approach employed a stacked PI pad configuration using four inductors to block RF from the external bias/control circuitry. At lower RF frequencies, such as 100–500 MHz, these inductors are too large to be manufactured on an RF LSI chip. Thus, eight input/output pads would be needed to go off-chip and back on-chip for the inductors.

The differential signal on the input line 452 is directed to an attenuation line 456 or a non-attenuation line 458, and then to an output line 460. The attenuation line 456 includes a resistor $R_1$ that combines with resistors $R_5$ and $R_7$ in a voltage divider network to provide the attenuation. The non-attenuation line 458 includes a PIN diode 462 that passes the signal unattenuated when it is biased. Likewise, the differential signal on the input line 454 is directed to an attenuation line 466 or a non-attenuation line 468, and then to an output line 470. The attenuation line 466 includes a resistor $R_2$ that combines with resistors $R_6$ and $R_8$ in a voltage divider network to provide the attenuation. The non-attenuation line 468 includes a PIN diode 472 that passes the signal unattenuated when it is biased. A logical high signal on a control line 474 and a logical low signal on a control line 478 biases the diodes 462 and 472 to select the non-attenuation lines 458 and 468. A logical low signal on the control line 474 and a logical high signal on the control line 478 removes the bias on the diodes 462 and 472 so that the non-attenuation lines 458 and 468 are open circuits to the RF signal, and thus the signals go through the attenuation lines 456 and 466.

Because the input signal is a differential signal, the signals on the input lines 452 and 454 are 180° out of phase with each other. When the signals propagate down the lines 452 and 454, they enter line 482. When the signals reach the halfway point between the lines 452 and 454 at node 484 they cancel each other out. Therefore, by coupling the control line 474 to the node 484, no RF signal enters the control line 474. Likewise, the control line 478 is coupled to node 486 halfway between the output lines 460 and 470 so that no RF signal enters the control line 478. Thus, no RF blocking components, such as inductors, are required to protect the integrity of the DC bias control signal.

Because the attenuator 450 could provide a relatively large amount of attenuation, $R_1$ and $R_2$ would typically need to be large to provide the desired attenuation. However, as $R_1$ and $R_2$ get bigger they begin to compete with the open circuit provided by the diodes 462 and 472 in the attenuation mode, reducing the effectiveness of the attenuation and decreasing the effective bandwidth of the signal. To overcome this problem, the present invention proposes employing a shunt diode 490 in the line 456 and a shunt diode 492 in the line 466. When the control line 478 is high to select the attenuation lines 456 and 466, the diode 490 is biased, and the ratio of the shunt resistance caused by the parallel resistors $R_5$ and $R_7$ to the series resistor $R_2$ provides the attenuation. Likewise, when the control line 478 is high to select the attenuation lines 456 and 466, the diode 492 is biased, and the ratio of the shunt resistance provided by the parallel resistors $R_6$ and $R_8$ to the series resistor $R_2$ provides the attenuation. This configuration allows the resistors $R_1$ and $R_2$ to be relatively small and still provide a large attenuation. Resistor $R_{11}$ provides more current limiting capability when the diodes 490 and 492 are biased.

When the attenuator 450 is in the non-attenuation mode, the input impedance is equal to the parallel combination of resistors $R_3$ and $R_4$ and resistors $R_5$ and $R_6$. However, when the attenuator 450 is in the attenuation mode, the resistors $R_1$ and $R_2$ in the attenuation lines 456 and 466 drive up the input impedance. In one embodiment, the input impedance in the non-attenuation mode is about 200 ohms and the input impedance in the attenuation mode is about 400 ohms.

Circuitry is provided to match the impedance of the attenuator 450 to the impedance of the rest of the system for both the attenuation modes, according to the invention. Particularly, the attenuator 450 includes an impedance matching network 496 including resistors $R_9$ and $R_{10}$ and diodes 498, and 500. When a high signal is provided on the control line 478 for the attenuation condition, a high signal is also provided on control line 502 to bias the diodes 498 and 500 and couple the resistors $R_9$ and $R_{10}$ in the circuit to change the input impedance. In this embodiment, the control lines 478 and 502 are separate inputs to provide better power control. However, in an alternate design, the control lines 478 and 502 can be tied to the same line because they both go high at the same time. Capacitors $C_1$–$C_4$ are DC blocking capacitors that prevent DC signals from disturbing the RF input and output signals of the attenuator 450.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. A multiplexer and switched gain circuit for multiplexing differential analog signals from a first channel and a second channel, both of the first channel and the second channel differential analog signals include a first part and a second part, said circuit comprising:

an output line;

a current source for providing a source of current, a first conduction path coupling the current source and the output line, said first conduction path including a plurality of switching devices and at least one gain device, wherein the first part of the first channel differential signal is coupled to a first switching device in the first conduction path and the second part of the first channel differential signal is coupled to a second switching device in the first conduction path, and wherein a first control line is coupled to at least one other switching device in the first conduction path, said first control line providing a control signal to turn on the first conduction path to transfer the first channel differential signal to the output line with a gain provided by the at least one gain device in the first conduction path; and a second conduction path coupling the current source and the output line, said second conduction path including a plurality of switching devices and at least one gain device, wherein the first part of the second channel differential signal is coupled to a third switching device in the second conduction path and the second part of the second channel differential signal is coupled to a fourth switching device in the second conduction path, and wherein a second control line is coupled to at least one other switching device in the second conduction path, said second control line providing a control signal to turn on the second conduction path to transfer the second channel differential signal to the output line with a gain provided by the at least one gain device in the second conduction path.

2. The circuit according to claim 1 further comprising a third conduction path coupling the current source and the output line, said third conduction path including a plurality of switching devices and at least one gain device, wherein the first part of the first channel differential signal is coupled to a fifth switching device in the third conduction path and the second part of the first channel differential signal is coupled to a sixth switching device in the third conduction path, and wherein a third control line is coupled to at least one other switching device in the third conduction path, said third control line providing a control signal to turn on the third conduction path to transfer the first channel differential signal to the output line with a gain provided by the at least one gain device in the third conduction path.

3. The circuit according to claim 2 wherein one of the at least one gain device in the first conduction path and the at least one gain device in the third conduction path provides positive gain to the first channel differential signal and the other at least one gain device provides no gain to the first channel differential signal.

4. The circuit according to claim 2 wherein one of the at least one gain device in the first conduction path and the at least one gain device in the third conduction path provides attenuation to the first channel differential signal.

5. The circuit according to claim 2 further comprising a fourth conduction path coupling the current source and the output line, said fourth conduction path including a plurality of switching devices and at least one gain device, wherein the first part of the second channel differential signal is coupled to a seventh switching device in the fourth conduction path and the second part of the second channel differential signal is coupled to an eighth switching device in the fourth conduction path, and wherein a fourth control line is coupled to at least one other switching device in the fourth conduction path, said fourth control line providing a control signal to turn on the fourth conduction path to transfer the second channel differential signal to the output line with a gain provided by the at least one gain device in the fourth conduction path.

6. The circuit according to claim 5 wherein one of the at least one gain device in the second conduction path and the at least one gain device in the fourth conduction path provides positive gain and the other at least one gain device provides no gain.

7. The circuit according to claim 1 wherein the first control line is coupled to a fifth and a sixth switching device in the first conduction path, and the second control line is coupled to a seventh and an eighth switching device in the second conduction path.

8. The circuit according to claim 1 wherein the switching devices are bipolar transistors, and wherein the signal coupled to a bipolar transistor is coupled to a base terminal of the bipolar transistor.

9. The circuit according to claim 1 wherein the gain devices are degenerative resistors.

10. The circuit according to claim 1 wherein the current source includes two bipolar transistors and two resistors.

11. The circuit according to claim 1 wherein the first channel is a primary channel and the second channel is a diversity channel in a diversity receiver.

12. A multiplexer and switched gain circuit for multiplexing a plurality of analog input signals, said circuit comprising:

a plurality of input lines responsive to the analog signals;

an output line;

a current source providing a source of current, and a plurality of conduction paths coupling the current source and the output line, each conduction path including a plurality of switching devices and at least one gain device, wherein an input line is coupled to one of the switching devices in each conduction path, and wherein a control line is coupled to another switching device in each conduction path, said control line selectively providing a control signal to turn on the switching device in the conduction path to transfer the analog signal on the input line to the output line with a gain provided by the at least one gain device in the conduction path.

13. The circuit according to claim 12 wherein the at least one gain device in each conduction path provides one of either no gain, positive gain or attenuation.

14. The circuit according to claim 12 wherein the gain devices are degenerative resistors.

15. The circuit according to claim 12 wherein the switching devices are bipolar transistors and the signal applied to the bipolar transistor is applied to a base terminal of the transistor.

16. The circuit according to claim 12 wherein the analog signals are differential analog signals.

17. The circuit according to claim 16 wherein the differential analog signals are from a primary channel and diversity channel of a diversity receiver.

18. The circuit according to claim 12 wherein the current source includes two bipolar transistors and two resistors.

19. A multiplexer and switched gain circuit for multiplexing differential analog signals from a primary channel and a diversity channel in a diversity receiver, both of the primary channel and the diversity channel analog signals including a first part and a second part, said circuit comprising:

an output line;

a current source for providing a source of current, a first primary channel conduction path coupling the current source and the output line, said first primary channel conduction path including a first bipolar transistor responsive to the first part of the primary channel differential signal at its base terminal, a second bipolar transistor responsive to the second part of the primary channel differential analog signal at its base terminal, a third bipolar transistor and a fourth bipolar transistor both coupled to a first control line at their base terminal, said first primary channel conduction path further including a first degenerative resistor, said first control line providing a control signal to turn on the first primary channel conduction path to transfer the primary channel differential analog signal to the output line with a gain provided by the first degenerative resistor;

a second primary channel conduction path coupled to the current source and the output line, said second primary channel conduction path including a fifth bipolar transistor responsive to the first part of the primary channel differential signal at its base terminal, a sixth bipolar transistor responsive to the second part of the primary channel differential analog signal at its base terminal, a seventh bipolar transistor and an eighth bipolar transistor both coupled to a second control line at their base terminal, said second primary channel conduction path further including a second degenerative resistor, said second control line providing a control signal to turn on the second primary channel conduction path to transfer the primary channel differential analog signal to the output line with a gain provided by the second degenerative resistor;

a first diversity channel conduction path coupling the current source and the output line, said first diversity channel conduction path including a ninth bipolar transistor responsive to the first part of the diversity channel differential signal at its base terminal, a tenth bipolar transistor responsive to the second part of the diversity channel differential analog signal at its base terminal, an eleventh bipolar transistor and a twelfth bipolar transistor both coupled to a third control line at their base terminal, said first diversity channel conduction path further including a third degenerative resistor, said third control line providing a control signal to turn on the first diversity channel conduction path to transfer the diversity channel differential analog signal to the output line with a gain provided by the third degenerative resistor; and a second diversity channel conduction path coupling the current source and the output line, said second diversity channel conduction path including a thirteenth bipolar transistor responsive to the first part of the diversity channel differential signal at its base terminal, a fourteenth bipolar transistor responsive to the second part of the diversity channel differential analog signal at its base terminal, a fifteenth bipolar transistor and a sixteenth bipolar transistor both coupled to a fourth control line at their base terminal, said second diversity channel conduction path further including a fourth degenerative resistor, said fourth control line providing a control signal to turn on the second diversity channel conduction path to transfer the second diversity channel differential analog signal to the output line with a gain provided by the fourth degenerative resistor.

20. The circuit according to claim 19 wherein the first and third degenerative resistors provide positive signal gain and the second and fourth degenerative resistors provide no signal gain.

21. The circuit according to claim 19 wherein the current source includes two bipolar transistors and two resistors.

22. A multiplexer for multiplexing analog signals, said multiplexer comprising:

an output line;

a first signal path responsive to a first analog signal, said first signal path including a first amplifier for amplifying the first analog signal, said first signal path being coupled to the output line;

a second signal path responsive to the first analog signal, said second signal path being coupled to the output line;

a third signal path responsive to a second analog signal, said third signal path including a second amplifier for amplifying the second analog signal, said third signal path being coupled to the output line; and a fourth signal path responsive to the second analog signal, said fourth signal path being coupled to the output line, wherein the multiplexer selectively outputs the first or second analog signal to the output line through the first, second, third or fourth signal path.

23. The multiplexer according to claim 22 wherein the second signal path and the fourth signal path do not provide signal amplification.

24. The multiplexer according to claim 22 wherein the first and second analog signals are differential analog signals.

25. The multiplexer according to claim 22 wherein the multiplexer is employed in a diversity receiver, where the first analog signal is a primary channel analog signal and the second analog signal is a diversity channel analog signal.

26. A multiplexer for multiplexing analog signals, said multiplexer comprising:

an output line;

a first signal path responsive to a first analog signal, said first signal path including an amplifier for amplifying the first analog signal, said amplifier including a degenerative resistor, said first signal path being coupled to the output line; and a second signal path responsive to a second analog signal, said second signal path being coupled to the output line, wherein the multiplexer selectively outputs the first or second analog signal on the output line.

27. The multiplexer according to claim 22 wherein the first and second amplifiers includes a degenerative resistor.

* * * * *